United States Patent
Kim et al.

(10) Patent No.: US 12,419,144 B2
(45) Date of Patent: Sep. 16, 2025

(54) LIGHT EMITTING DEVICE FOR DISPLAY AND BACKLIGHT UNIT INCLUDING THE SAME

(71) Applicant: SAMSUNG ELECTRONICS CO., LTD., Suwon-si (KR)

(72) Inventors: Seongmin Kim, Suwon-si (KR); Jeongeun Yun, Suwon-si (KR); Jeongrok Oh, Suwon-si (KR); Sungwoo Choi, Suwon-si (KR); Chulsoo Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/885,155

(22) Filed: Sep. 13, 2024

(65) Prior Publication Data

US 2025/0006872 A1 Jan. 2, 2025

Related U.S. Application Data

(63) Continuation of application No. 18/236,105, filed on Aug. 21, 2023, now Pat. No. 12,119,431.

(30) Foreign Application Priority Data

Sep. 1, 2022 (KR) .......................... 10-2022-0111008

(51) Int. Cl.
*H01L 33/50* (2010.01)
*F21V 8/00* (2006.01)
(Continued)

(52) U.S. Cl.
CPC ....... *H10H 20/8513* (2025.01); *G02B 6/0073* (2013.01); *H01L 25/0753* (2013.01); *H10H 20/8514* (2025.01)

(58) Field of Classification Search
CPC . H01L 33/504; H01L 25/0753; H01L 33/505; G02B 6/0073; G02B 6/0046;
(Continued)

(56) References Cited

U.S. PATENT DOCUMENTS 6,372,608 B1  4/2002 Shimoda et al.
6,645,830 B2  11/2003 Shimoda et al.
(Continued)

OTHER PUBLICATIONS

Robert J. Lucas et al., "Measuring and using light in the melanopsin age", Trends in Neurosciences, Jan. 2014, vol. 37, No. 1, pp. 1-9.
(Continued)

*Primary Examiner* — Kevin Quarterman
(74) *Attorney, Agent, or Firm* — Sughrue Mion, PLLC

(57) ABSTRACT

A light emitting device includes a first light emitter including a first light emitting chip emitting first blue light and at least one among a first phosphor and a second phosphor, the first light emitter being configured to emit second blue light, and a second light emitter including a second light emitting chip emitting third blue light and at least one among a third phosphor and a fourth phosphor, the second light emitter being configured to emit fourth blue light, wherein a ratio of an intensity of a peak wavelength of the fourth blue light to an intensity of a peak wavelength of the second blue light is greater than or equal to 0.6.

20 Claims, 12 Drawing Sheets

(51) Int. Cl.
    *H01L 25/075*     (2006.01)
    *H10H 20/851*     (2025.01)

(58) Field of Classification Search
    CPC ............ G02B 6/0068; G02B 6/0001; G02F 1/133614; G02F 1/133514; G02F 1/133553; G02F 1/133615; G02F 2202/36; G02F 2203/055
    See application file for complete search history.

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,569,987 B2 | 8/2009 | Naitou |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,723,217 B2 | 5/2014 | Moon |
| 8,735,931 B2 | 5/2014 | Han et al. |
| 8,766,295 B2 | 7/2014 | Kim |
| 9,312,246 B2 | 4/2016 | Roth et al. |
| 10,018,776 B2 | 7/2018 | Itoh et al. |
| 11,251,344 B2 | 2/2022 | Kim et al. |
| 11,287,090 B2 | 3/2022 | Krames et al. |
| 2014/0055982 A1 | 2/2014 | Tao |
| 2014/0340890 A1 | 11/2014 | Hata |
| 2019/0198724 A1 | 6/2019 | Amiya |
| 2020/0006298 A1 | 1/2020 | Kim et al. |
| 2020/0303358 A1 | 9/2020 | Zhang |
| 2020/0303598 A1 | 9/2020 | Kim |
| 2020/0313045 A1 | 10/2020 | Asai |
| 2020/0381596 A1 | 12/2020 | Choi |
| 2021/0296294 A1 | 9/2021 | Sun |
| 2022/0020732 A1 | 1/2022 | Li et al. |
| 2023/0288042 A1 | 9/2023 | Iwakura |

OTHER PUBLICATIONS

U.S. Appl. No. 18/236,105, filed Aug. 21, 2023.

LIGHT EMITTING DEVICE FOR DISPLAY AND BACKLIGHT UNIT INCLUDING THE SAME

CROSS-REFERENCE TO RELATED APPLICATION

This application is a continuation application of U.S. patent application Ser. No. 18/236,105, filed Aug. 21, 2023, in the US Patent and Trademark Office, which is based on and claims priority under 35 U.S.C. § 119 to Korean Patent Application No. 10-2022-0111008, filed on Sep. 1, 2022, in the Korean Intellectual Property Office, the disclosure of which is incorporated by reference herein in its entirety.

BACKGROUND

The present disclosure relates generally to a light emitting device for a display and a backlight unit including the same.

Semiconductor light emitting devices, such as light-emitting diodes (LEDs), have a long lifespan, low power consumption, a high response speed, and eco-friendliness and are used as light sources in various products, such as lighting fixtures and backlights of displays.

Unlike LEDs used for lighting, LEDs used for backlights of displays are required to have an appropriate color gamut to implement color close to the original on a screen.

SUMMARY

Example embodiments provide a light emitting device for a display, which may improve the circadian rhythm of the human body, and a backlight unit including the light emitting device.

Additional aspects will be set forth in part in the description which follows and, in part, will be apparent from the description, or may be learned by practice of the presented embodiments.

According to an aspect of an example embodiment, a light emitting device includes: a first light emitter configured to emit second blue light, the first light emitter including: a first light emitting chip configured to emit first blue light having a peak wavelength in a range of about 430 nm to about 465 nm, at least one of a first phosphor configured to convert part of the first blue light into light having a peak wavelength in a range of about 530 nm to about 560 nm, and a second phosphor configured to convert part of the first blue light into light having a peak wavelength in a range of about 600 nm to about 650 nm; and a second light emitter configured to emit fourth blue light, the second light emitter including: a second light emitting chip configured to emit third blue light having a peak wavelength in a range of about 465 nm to about 500 nm, and at least one of a third phosphor configured to convert part of the third blue light into light having a peak wavelength in the range of about 530 nm to about 560 nm, and a fourth phosphor configured to convert part of the third blue light into light having a peak wavelength in the range of about 600 nm to about 650 nm, wherein a ratio of an intensity of a peak wavelength of the fourth blue light to an intensity of a peak wavelength of the second blue light is greater than or equal to 0.6.

According to an aspect of an example embodiment, a light emitting device includes: a first light emitter configured to emit second blue light having a peak wavelength in the range of about 430 nm to about 465 nm, the first light emitter including: a first light emitting chip configured to emit first blue light having a peak wavelength in a range of about 430 nm to about 465 nm, a first wavelength conversion phosphor including at least one of a green phosphor and a red phosphor, and a first resinous body around the first light emitting chip and the first wavelength conversion phosphor; a second light emitter configured to emit fourth blue light having a peak wavelength in the range of about 465 nm to about 500 nm, the second light emitter including: a second light emitting chip configured to emit third blue light having a peak wavelength in a range of about 465 nm to about 500 nm, a second wavelength conversion phosphor including at least one of the green phosphor and the red phosphor, and a second resinous body around the second light emitting chip and the second wavelength conversion phosphor; a light emitting package around the first light emitter and the second light emitter, and exposing a top surface of the first light emitter and a top surface of the second light emitter; and a wavelength conversion film in a path of the second blue light and a path of the fourth blue light, the wavelength conversion film being configured to: convert at least part of the second blue light into first white light, and convert at least part of the fourth blue light into second white light, wherein a ratio of an intensity of the peak wavelength of the fourth blue light to an intensity of the peak wavelength of the second blue light is greater than or equal to 0.6.

According to an aspect of an example embodiment, a backlight unit includes: a light guide plate; a reflector; and a light emitting module including a light emitting device and a substrate, wherein the light emitting device includes a first light emitter and a second light emitter, wherein the first light emitter is configured to emit second blue light having a peak wavelength in the range of about 430 nm to about 465 nm, and includes: a first light emitting chip configured to emit first blue light having a peak wavelength in a range of about 430 nm to about 465 nm, a first wavelength conversion phosphor including at least one of a green phosphor and a red phosphor, and a first encapsulation material around the first light emitting chip and the first wavelength conversion phosphor; wherein the second light emitter is configured to emit fourth blue light having a peak wavelength in the range of about 465 nm to about 500 nm, and includes: a second light emitting chip configured to emit third blue light having a peak wavelength in a range of about 465 nm to about 500 nm, a second wavelength conversion phosphor including at least one of the green phosphor and the red phosphor, and a second encapsulation material around the second light emitting chip and the second wavelength conversion phosphor; a light emitting package around the first light emitter and the second light emitter, and exposing a top surface of the first light emitter and a top surface of the second light emitter; and a wavelength conversion film configured to convert at least part of the second blue light and at least part of the fourth blue light into white light, wherein the light emitting module is in an edge portion of the light guide plate, and wherein a ratio of an intensity of the peak wavelength of the fourth blue light to an intensity of the peak wavelength of the second blue light is greater than or equal to 0.6.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
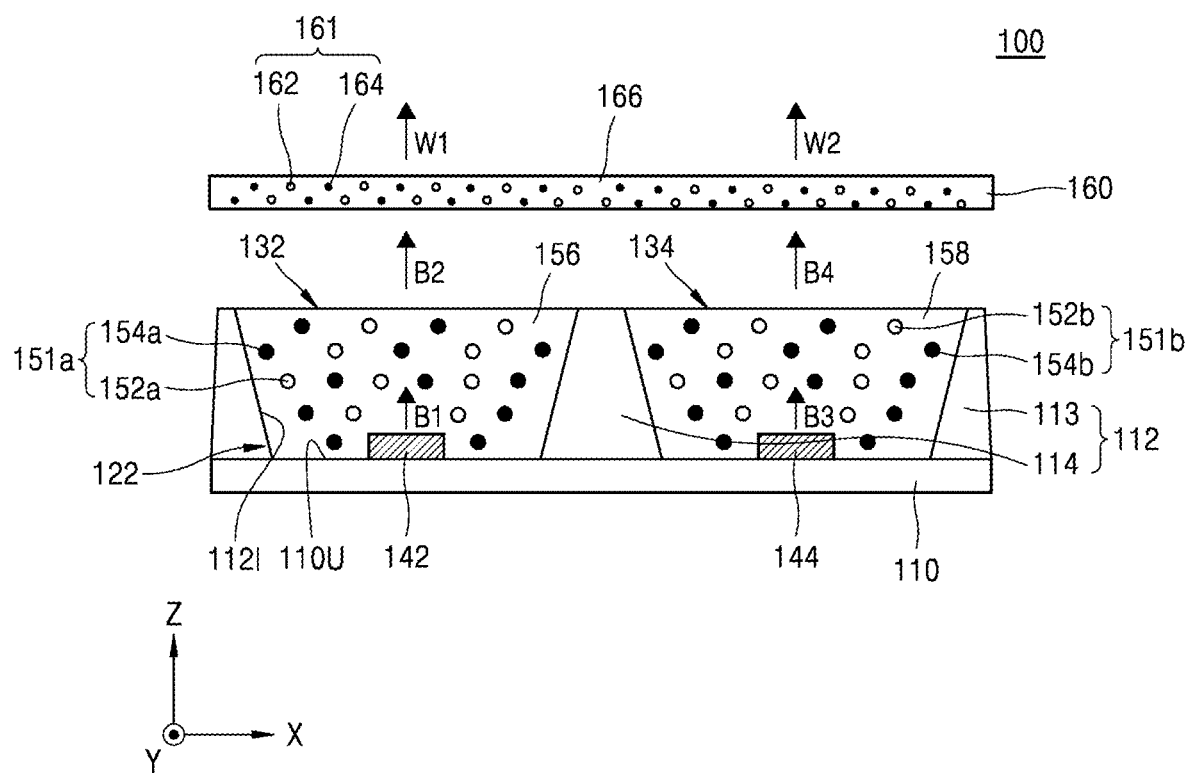
FIG. 1 is a cross-sectional view of a light emitting device for a display, according to one or more example embodiments.

Hereinafter, example embodiments are described in detail with reference to the accompanying drawings. In the drawing, like reference characters denote like elements, and redundant descriptions thereof will be omitted.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

In related art, the influence of blue light on the circadian rhythm is not considered. For example, light induced from a blue light having a peak wavelength in a range of 430 nm to 465 nm suppresses the release of melatonin that is a hormone closely involved in sleep and may thus cause a sleep disorder. Example embodiments of the disclosure may be directed to light emitting devices that are appropriate to the circadian rhythm and realizing the three primary colors for displays.

Figure 2:
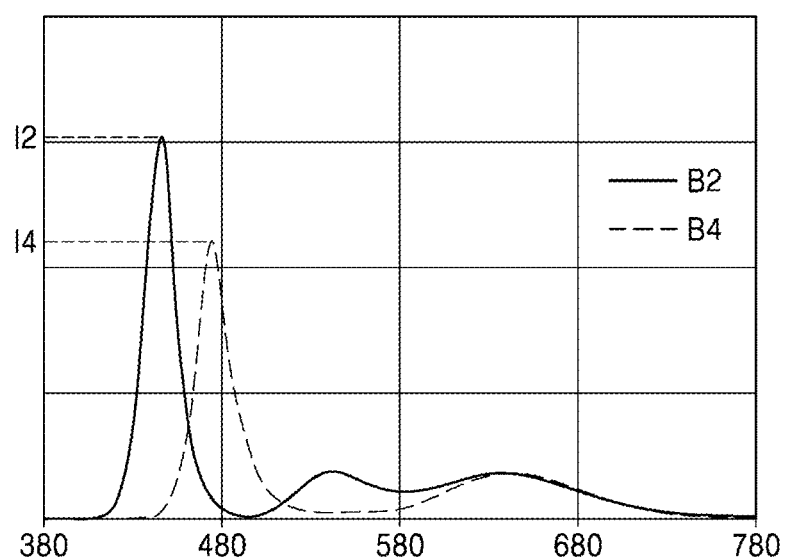
FIG. 2 is a diagram of the emission spectra of second blue light and fourth blue light of the light emitting device of FIG. 1 according to one or more example embodiments.
Figure 3:
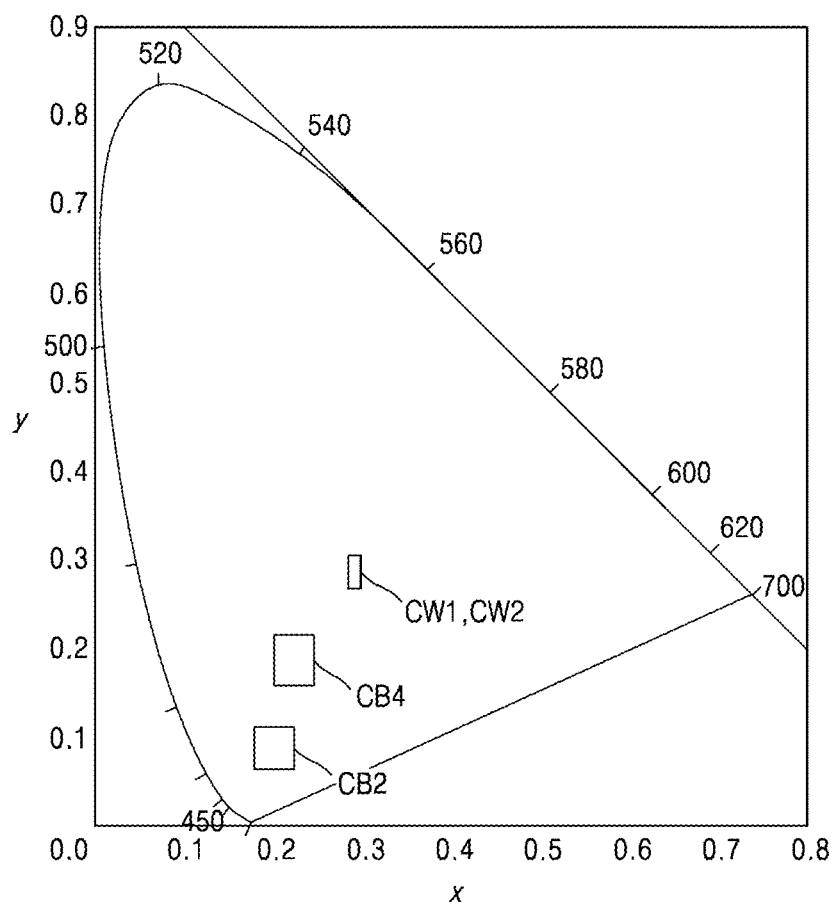
FIG. 3 is a diagram of a CIE 1931 color coordinate system showing the color coordinates of second blue light, fourth blue light, first white light, and second white light of the light emitting device of FIG. 1 according to one or more example embodiments.

FIG. 1 is a cross-sectional view of a light emitting device 100 for a display, according to one or more example embodiments. FIG. 2 is a diagram of the emission spectra of second blue light and fourth blue light of the light emitting device of FIG. 1 according to one or more example embodiments. FIG. 3 is a diagram of a CIE 1931 color coordinate system showing the color coordinates of second blue light, fourth blue light, first white light, and second white light of the light emitting device of FIG. 1 according to one or more example embodiments. In particular, FIG. 2 illustrates the emission spectra of second blue light B2 and fourth blue light B4 of the light emitting device 100 of FIG. 1. FIG. 3 illustrates a CIE 1931 color coordinate system showing the color coordinates of the second blue light B2, the fourth blue light B4, first white light W1, and second white light W2 of the light emitting device 100 of FIG. 1.

The light emitting device 100 for a display may include a substrate 110, a light emitting package 112, a first light emitter 132, and a second light emitter 134.

The first light emitter 132 and the second light emitter 134 may be on the substrate 110 and housed in the light emitting package 112. The light emitting package 112 may have a recess 122, which is defined by a top surface 110U of the substrate 110 and an inner surface 112I of the light emitting package 112. The first light emitter 132 and the second light emitter 134 may be respectively accommodated in recesses 122.

The light emitting package 112 may surround the first light emitter 132 and the second light emitter 134 and expose the respective top surfaces of the first and second light emitters 132 and 134. For example, the light emitting package 112 may include an outer wall 113 and a partition 114. The first light emitter 132 may be separated from the second light emitter 134 by the partition 114.

Each of the recesses 122 may be configured to reflect light, which is emitted from the first or second light emitter 132 or 134, to the exposed top surface of first or second light emitter 132 or 134. For example, the inner surface 112I of the light emitting package 112 may be oblique to the top surface 110U of the substrate 110, and the cross-sectional area of each recess 122 in a horizontal direction (the X direction and/or the Y direction) may increase away in a vertical direction (the Z direction) from the top surface 110U of the substrate 110.

The substrate 110 may correspond to a printed circuit board (PCB) including a wiring structure. For example, the wiring structure may be electrically connected to a first light emitting chip 142 of the first light emitter 132 and a second light emitting chip 144 of the second light emitter 134. The first light emitting chip 142 and the second light emitting chip 144 may be independently driven.

The light emitting package 112 may include polymer resin. For example, the light emitting package 112 may include polymer resin including a reflective material.

The first light emitter 132 may include the first light emitting chip 142, first wavelength conversion phosphor 151a, and a first encapsulation material 156 surrounding the first light emitting chip 142 and the first wavelength conversion phosphor 151a.

The first light emitting chip 142 may emit first blue light B1 having a peak wavelength in a range of about 430 nm to about 465 nm. The first blue light B1 may have a peak wavelength in a range of about 445 nm to about 455 nm and desirably have a peak wavelength at about 450 nm. A coordinate of the first blue light B1 is around the edge of the diagram in FIG. 3 called spectral locus. For example, the first blue light B1 represents almost pure monochromatic light. A full width at half maximum of the first blue light B1, for example, may be less than 19 nm.

The first wavelength conversion phosphor 151a may include at least one of a first phosphor 152a and a second phosphor 154a. The first phosphor 152a may convert part of the first blue light B1 into light having a peak wavelength in a range of about 530 nm to about 560 nm. The second phosphor 154a may convert part of the first blue light B1 into light having a peak wavelength in a range of about 600 nm to about 650 nm.

The first light emitter 132 may emit the second blue light B2 having a peak wavelength in a range of about 430 nm to about 465 nm. The second blue light B2 may be formed by the sum of the part of the first blue light B1 converted by the first phosphor 152a, the part of the first blue light B1 converted by the second phosphor 154a, and the majority of the first blue light B1 not converted by phosphors. In a range of first coordinates CB2 corresponding to the CIE 1931 coordinates of the second blue light B2, an x-coordinate may be about 0.1 to about 0.3 and a y-coordinate may be about 0.02 to about 0.2. For example, in the range of the first coordinates CB2 corresponding to the CIE 1931 coordinates of the second blue light B2, the x-coordinate may be about 0.18 to about 0.22 and the y-coordinate may be about 0.06 to about 0.12.

The second light emitter 134 may include the second light emitting chip 144, a second wavelength conversion phosphor 151b, and a second encapsulation material 158 surrounding the second light emitting chip 144 and the second wavelength conversion phosphor 151b.

The second light emitting chip 144 may emit third blue light B3 having a peak wavelength in a range of about 465 nm to about 500 nm. The third blue light B3 may have a peak wavelength in a range of about 475 nm to about 485 nm and desirably have a peak wavelength at about 480 nm. A coordinate of the third blue light B3 is around the spectral locus of the diagram of FIG. 3. For example, the third blue light B3 represents almost pure monochromatic light. A full width at half maximum of the third blue light B3, for example, may be less than 19 nm.

The second wavelength conversion phosphor 151b may include at least one among a third phosphor 152b and a fourth phosphor 154b. The third phosphor 152b may convert part of the third blue light B3 into light having a peak wavelength in a range of about 530 nm to about 560 nm. The fourth phosphor 154b may convert part of the third blue light B3 into light having a peak wavelength in a range of about 600 nm to about 650 nm.

The second light emitter 134 may emit the fourth blue light B4 having a peak wavelength in a range of about 465 nm to about 500 nm. The fourth blue light B4 may be formed by the part of the third blue light B3 converted by the third phosphor 152b, the part of the third blue light B3 converted by the fourth phosphor 154b, and the majority of the third blue light B3 not converted by phosphors. In a range of second coordinates CB4 corresponding to the CIE 1931 coordinates of the fourth blue light B4, an x-coordinate may be about 0.05 to about 0.3 and a y-coordinate may be about 0.05 to about 0.3. For example, in the range of the second coordinates CB4 corresponding to the CIE 1931 coordinates of the fourth blue light B4, the x-coordinate may be about 0.2 to about 0.24 and the y-coordinate may be about 0.16 to about 0.22.

The light emitting device 100 for a display may include the first light emitter 132 emitting the second blue light B2 and the second light emitter 134 emitting the fourth blue light B4, thereby improving the circadian rhythm of the human body. For example, the second blue light B2 may not interfere with the release of melatonin, which is deeply involved in sleep, and the fourth blue light B4 may suppress the release of melatonin. For example, the second light emitting chip 144 may be driven more predominantly than the first light emitting chip 142 during the day, and the first light emitting chip 142 may be driven more predominantly than the second light emitting chip 144 during the night. For example, when the drive strengths of the first and second light emitting chips 142 and 144 are controlled based on time, the release of melatonin may be controlled, and accordingly, the circadian rhythm of the human body may be improved.

A melanopic ratio (MR) may be used as an index quantifying the effect of light on the circadian rhythm of the human body. The MR may also be referred to as a melanopic/photopic (M/P) ratio. For example, an MR may quantify the response of human eyes to light and may refer to a ratio of a melanopic (e.g., circadian) intensity to a photopic (e.g., visual) intensity. For example, an MR may indicate how much a light source stimulates the circadian system. An MR may be given by Equation (1) as follows.

$$MR = \frac{EML}{Im} \quad (1)$$

$$EML = 72983.25 * \int_{380}^{780} SPD(\lambda) * \text{Melanopic sensitivity}(\lambda) d\lambda$$

$$Im = 683 * \int_{380}^{780} SPD(\lambda) * \text{Photopic sensitivity}(\lambda) d\lambda.$$

In Equation (1), SPD($\lambda$) is the color profile of light measured by equipment like a spectrometer, and each of Melanopic sensitivity($\lambda$) and the Photopic sensitivity($\lambda$) may refer to functions, such as functions proposed in "Measuring and Using Light in the Melanopsin Age" by Lucas et al., the contents of which are incorporated by reference herein. The EML may refer to an equivalent melanopic lux (EML).

For example, when an EML is high, the release of melatonin may be suppressed and there may be a boost of alertness. The effects on hormone regulation may be compared based on the EML of light.

A ratio of an intensity I4 of the peak wavelength of the fourth blue light B4 to an intensity I2 of the peak wavelength of the second blue light B2 may be greater than or equal to 0.6. Accordingly, the first emitter 132 and the second emitter 134 may be driven together, and the melanopic sensitivity of the light emitting device 100 including a wavelength conversion film 160 may be improved. Accordingly, the circadian system control performance of the light emitting device 100 for a display according to embodiments may be increased within above range, and the color reproducibility of a backlight unit (300 in FIG. 10) including the light emitting device 100 for a display may also be increased.

The first wavelength conversion phosphor 151a of the first light emitter 132 may be provided in an amount of about 0.1 parts by weight to about 15 parts by weight per 100 parts by weight of the first encapsulation material 156. In some embodiments, the first wavelength conversion phosphor 151a of the first light emitter 132 may be provided in an amount of about 1 part by weight to about 10 parts by weight per 100 parts by weight of the first encapsulation material 156. In the range described above, the effect of the light emitting device 100 on the improvement of the circadian rhythm by inducing the release of hormone may be increased, and a high color reproducibility may be realized.

The second wavelength conversion phosphor 151b of the second light emitter 134 may be provided in an amount of about 0.1 parts by weight to about 20 parts by weight per 100 parts by weight of the second encapsulation material 158. In some embodiments, the second wavelength conversion phosphor 151b of the second light emitter 134 may be provided in an amount of about 1 part by weight to about 12 parts by weight (e.g., about 4 parts by weight to about 8 parts by weight), per 100 parts by weight of the second encapsulation material 158. In the range described above, the effect of the light emitting device 100 on the improvement of the circadian rhythm by suppressing the hormone may be increased, and a high color reproducibility may be realized.

A ratio of a content of the first wavelength conversion phosphor 151a to a content of the first encapsulation material 156 in the first light emitter 132 may be less than a ratio of a content of the second wavelength conversion phosphor 151b to a content of the second encapsulation material 158 in the second light emitter 134. Accordingly, the performance of the light emitting device 100 for a display may be increased.

A ratio of a content of the first phosphor 152a to a content of the second phosphor 154a in the first light emitter 132 may be about 0.5 to about 0.7. A ratio of a content of the third phosphor 152b to a content of the fourth phosphor 154b in the second light emitter 134 may be about 0.01 to about 0.2. The second light emitter 134 may not include the third phosphor 152b. In the content ranges described above with respect to the first to fourth phosphors 152a, 154a, 152b, and 154b, the hormone regulation performance of the light emitting device 100 for a display may be increased, and the backlight unit 300 including the light emitting device 100 may have a high color reproducibility.

Each of the first and third phosphors 152a and 152b may include at least one of β-SiAlON:Eu, $(Ga,Gd,Y)_2Al_5O_{12}$:Ce, $La_3Si_6Ni$:Ce, Eu-doped $(Sr,Ca,Ba)Si_2O_2N_2$:Eu, $(Ba,Sr)Al_2O_4$:Eu, $YBO_3$:Ce,Tb, $BaMgAl_{10}O_{17}$:Eu,Mn, $(Sr,Ca,Ba)(Al,Ga)_2S_4$:Eu, ZnS:Cu,Al, $Ca_8Mg(SiO_4)_4Cl_2$:Eu,Mn, $Ba_2SiO_4$:Eu, $(Ba,Sr)_2SiO_4$:Eu, $Ba_2(Mg,Zn)Si_2O_7$:Eu, $Sr_2Si_3O_8 \cdot 2SrCl_2$:Eu, $(Sr,Ca,Ba,Mg)P_2O_7N_8$:Eu,Mn, $(Sr,Ca,Ba,Mg)_3P_2O_8$:Eu,Mn, $Ca_3Sc_2Si_3O_{12}$:Ce, $CaSc_2O_4$:Ce, and $Ln_2Si_3O_3N_4$:Tb.

Each of the second and fourth phosphors 154a and 154b may include at least one of $(Sr,Ca)_2AlSiN_3$:Eu, $CaAlSiN_3$:Eu, $K_xSiF_y$:$Mn^{4+}$($2 \leq x \leq 3$, $4 \leq y \leq 7$), $Y_2O_2S$:Eu, $YVO_4$:Eu,Bi, $Y_2O_2S$:Eu,Bi,SrS:Eu, $(Ca,Sr)S$:Eu, $SrY_2S_4$:Eu, $CaLa_2S_4$:Ce, $(Sr,Ca,Ba)_3SiO_5$:Eu, and $(Sr,Ca,Ba)_2Si_5N_8$:Eu.

Each of the first and second encapsulation materials 156 and 158 may include epoxy resin, silicon, urethane resin, oxetane resin, acrylic resin, polycarbonate, polyimide, or a combination thereof.

The light emitting device 100 for a display may further include a wavelength conversion film 160 in a path of the second blue light B2 and a path of the fourth blue light B4. The wavelength conversion film 160 may include a wavelength conversion quantum dot 161 and a transparent encapsulation film 166 surrounding the wavelength conversion quantum dot 161. In some embodiments, the wavelength conversion film 160 may be on the top surface of the first light emitter 132 and the top surface of the second light emitter 134. Alternatively, the wavelength conversion film 160 may be separated from the top surface of the first light emitter 132 and the top surface of the second light emitter 134.

The wavelength conversion quantum dot 161 may refer to generally a semiconductor nanocrystal and have various shapes, such as an isotropic semiconductor nanocrystal, a quantum rod, and a quantum plate. For example, the aspect ratio of a quantum rod may be greater than 1 or greater than or equal to 2, 3, or 5. For example, the aspect ratio of a quantum rod may be less than or equal to 50, 30, or 20. The wavelength conversion quantum dot 161 may have a particle diameter of about 1 nm to about 100 nm. In some embodiments, the wavelength conversion quantum dot 161 may have a particle diameter of about 1 nm to about 80 nm. For example, the wavelength conversion quantum dot 161 may have a particle diameter of about 1 nm to about 50 nm or about 1 nm to about 20 nm. For example, when the wavelength conversion quantum dot 161 is not round, the particle diameter of the wavelength conversion quantum dot 161 may refer to the size of the longest portion thereof.

The wavelength conversion quantum dot 161 may include a binary compound, a ternary compound, or a quaternary compound in a uniform concentration distribution or in a partially different concentration distribution. In some embodiments, the wavelength conversion quantum dot 161 may have a core-shell structure, in which a quantum dot is surrounded by another quantum dot. For example, the interface between the core and the shell of a quantum dot may have a concentration gradient, in which the concentration of elements in the shell decreases toward the center of the shell. For example, the composition of the shell of a quantum dot may have a higher energy band gap than the composition of the core of the quantum dot, and accordingly, the quantum confinement effect occurs. For example, a quantum dot may have a structure which includes a single core and multiple shell layers surrounding the core. In this case, the multi-layer shell structure may include at least two layers of shells, and each layer may have a single composition, alloy, or concentration gradient. For example, among the multiple layers of shells, the energy band gap of each shell increases away from the core, and accordingly, the quantum confinement effect occurs.

When the wavelength conversion quantum dot 161 has a core-shell structure, the diameter of a core may be about 1 nm to about 30 nm. In some embodiments, the diameter of a core may be about 3 nm to about 10 nm. The thickness of a shell may be about 0.1 nm to about 20 mm. In some embodiments, the thickness of a shell may be about 0.5 nm to about 10 nm, about 0.5 nm to about 5 nm, or about 0.5 nm to about 2 nm.

The wavelength conversion quantum dot 161 may include at least one of a first quantum dot 162 and a second quantum dot 164. The first quantum dot 162 may convert part of each of the second blue light B2 and the fourth blue light B4 into light having a peak wavelength in a range of about 510 nm to about 550 nm. The second quantum dot 164 may convert part of each of the second blue light B2 and the fourth blue light B4 into light having a peak wavelength in a range of about 610 nm to about 660 nm.

The wavelength conversion film 160 may convert at least part of the second blue light B2 into the first white light W1. In a range of third coordinates CW1 corresponding to the CIE 1931 coordinates of the first white light W1, an x-coordinate may be about 0.28 to about 0.32 and a y-coordinate may be about 0.29 to about 0.33. Accordingly, within above range, the color reproducibility of a backlight unit (300 in FIG. 10) including the light emitting device 100 for a display may also be increased.

The wavelength conversion film 160 may convert at least part of the fourth blue light B4 into the second white light W2. In a range of fourth coordinates CW2 corresponding to the CIE 1931 coordinates of the second white light W2, an x-coordinate may be about 0.28 to about 0.32 and a y-coordinate thereof may be about 0.29 to about 0.33. Accordingly, within above range, the color reproducibility of a backlight unit (300 in FIG. 10) including the light emitting device 100 for a display may also be increased.

The EML of the second white light W2 may be greater than the EML of the first white light W1. For example, a first ratio, which is the ratio of the EML of the second white light W2 to the EML of the first white light W1, may be greater than 1. In this case, the effect of the EML of the second white light W2 derived from second emitter 134 having high melanopic sensitivity may be increased, and when the first emitter 132 and the second emitter 134 are driven together, the effect of the light emitting device 100 on the improvement of the circadian rhythm may be increased.

The wavelength conversion quantum dot 161 may be provided in an amount of about 5 parts by weight to about 30 parts by weight per 100 parts by weight of the transparent encapsulation film 166. The first quantum dot 162 may be provided in an amount of about 2.5 parts by weight to about 15 parts by weight, and for example, about 5 parts by weight to about 10 parts by weight, per 100 parts by weight of the transparent encapsulation film 166. The second quantum dot 164 may be provided in an amount of about 2.5 parts by weight to about 15 parts by weight, and for example, about 5 parts by weight to about 10 parts by weight, per 100 parts by weight of the transparent encapsulation film 166. In the ranges described above, the first white light W1 and the second white light W2 may respectively satisfy the range of the third coordinates CW1 and the range of the fourth coordinates CW2.

For example, an emission wavelength may be adjusted by changing the size and/or composition of the wavelength conversion quantum dot 161. The wavelength conversion quantum dot 161 may include a Group II-VI compound, a Group III-V compound, a Group IV-VI compound, a Group VI compound, or a combination thereof. For example, the Group II-VI compound may be a binary compound of CdSe, CdTe, ZnS, ZnSe, ZnTe, ZnO, HgS, HgSe, HgTe, MgSe, MgS, and a combination thereof, a ternary compound of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and a quaternary compound of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof. For example, the Group III-V compound may be a binary compound of GaN, GaP, GaAs, GaSb, AlN, AlP, AlAs, AlSb, InN, InP, InAs, InSb, and a combination thereof, a ternary compound of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof, and a quaternary compound of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. For example, the Group IV-VI compound may be a binary compound of SnS, SnSe, SnTe, PbS, PbSe, PbTe, and a combination thereof, a ternary compound of SnSeS, SnSeTe, SnSTe, PbSeS, PbSeTe, PbSTe, SnPbS, SnPbSe, SnPbTe, and a combination thereof, and a quaternary compound of SnPbSSe, SnPbSeTe, SnPbSTe, and a combination thereof. For example, the Group IV compound may be a single-element compound of Si, Ge, and a mixture thereof and a binary compound of SiC, SiGe, and a mixture thereof. For example, each of the first quantum dot 162 and the second quantum dot 164 may include at least one of InP/ZnS, InP/ZnSe, CdSe/CdS, CdSe/ZnS, PbS/ZnS, and InP/GaP/ZnS.

The quantum yield of the wavelength conversion quantum dot 161 may be greater than or equal to about 10% (e.g., about 30%, about 50%, about 60%, about 70%, or about 90%, but not limited thereto). For example, the wavelength conversion quantum dot 161 may have a relatively narrow spectrum. For example, the wavelength conversion quantum dot 161 may have a full width at half maximum (FWHM) of 45 nm or less. For example, the wavelength conversion quantum dot 161 may have an FWHM of 40 nm or less or 30 nm or less.

The transparent encapsulation film 166 may include epoxy resin, silicon, urethane resin, oxetane resin, acrylic resin, polycarbonate, polyimide, or a combination thereof.

Figure 4:
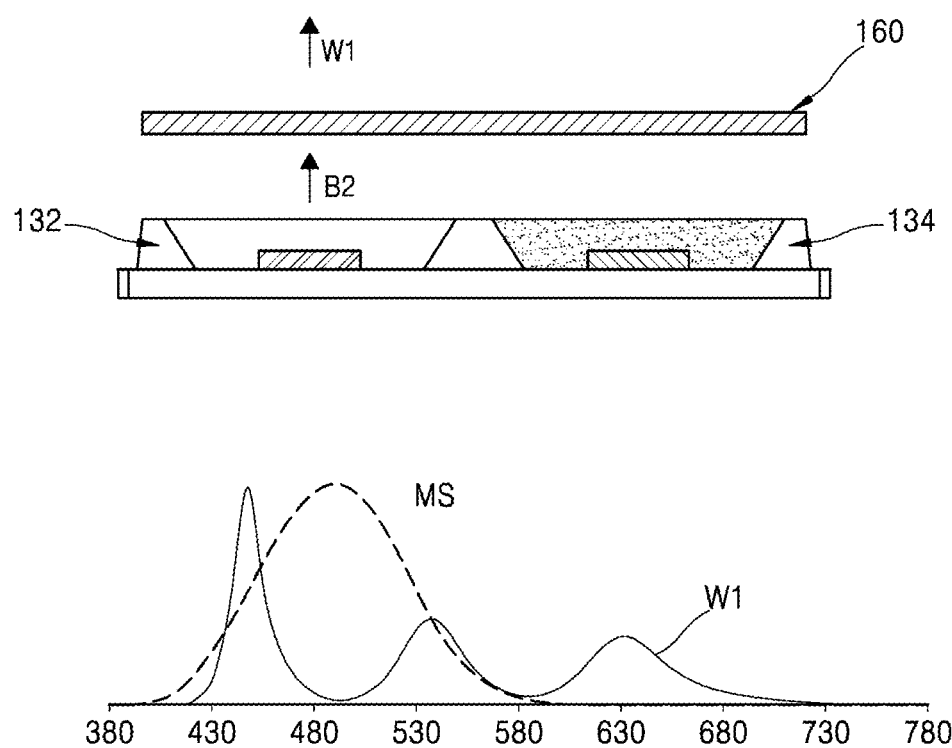
FIGS. 4 and 5 are diagrams of emission spectra with respect to the driving of a light emitting device for a display, according to one or more example embodiments.
Figure 5:
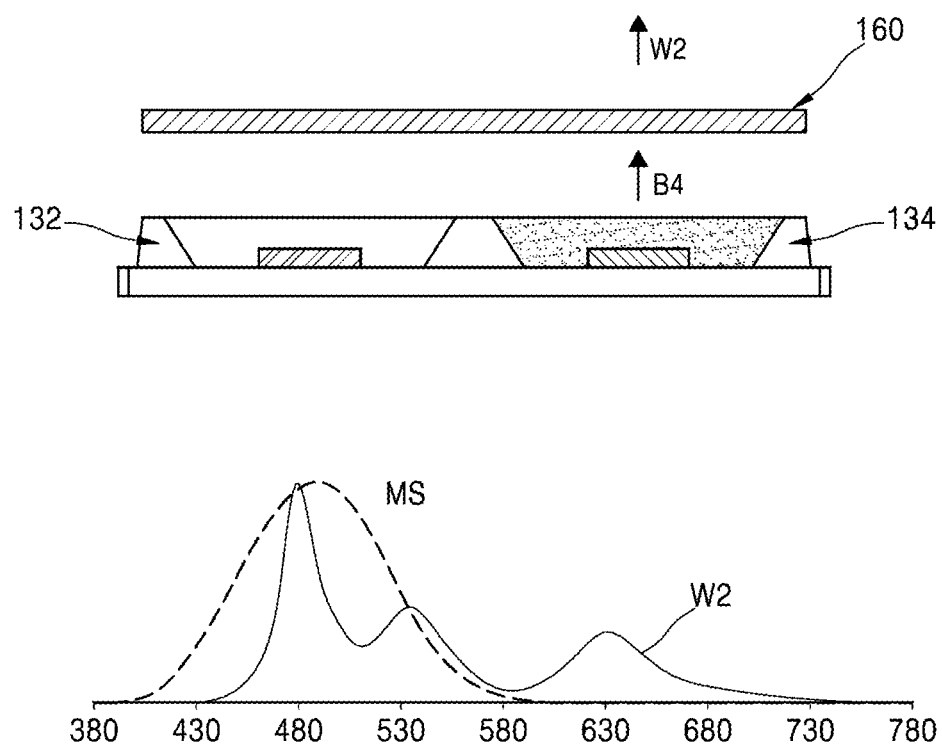

FIGS. 4 and 5 are diagrams of emission spectra with respect to the driving of the light emitting device 100 for a display, according to one or more example embodiments.

Referring to FIG. 4, when the first light emitter 132 of the light emitting device 100 for a display is driven, the first white light W1 may be emitted. The first white light W1 may have a peak wavelength in a range of about 430 nm to about 465 nm, a peak wavelength in a range of about 530 nm to about 560 nm, and a peak wavelength in a range of about 600 nm to about 650 nm. A melanopic sensitivity curve MS marked with the dashed line in FIG. 4 may have a peak wavelength in a range of about 465 nm to about 500 nm. For example, the emission spectrum curve of the first white light W1 may have a low value in the peak wavelength range of the melanopic sensitivity curve MS.

Referring to FIG. 5, when the second light emitter 134 of the light emitting device 100 for a display is driven, the second white light W2 may be emitted. The second white light W2 may have a peak wavelength in a range of about 465 nm to about 500 nm, a peak wavelength in a range of about 530 nm to about 560 nm, and a peak wavelength in a range of about 600 nm to about 650 nm. The emission spectrum curve of the second white light W2 may have a peak wavelength in the peak wavelength range of the melanopic sensitivity curve MS. For example, when the backlight unit 300 including the second white light W2 is used as a light source of a display, the release of melatonin of a person exposed to the display may be suppressed, and the person's circadian rhythm may be improved.

Figure 6:
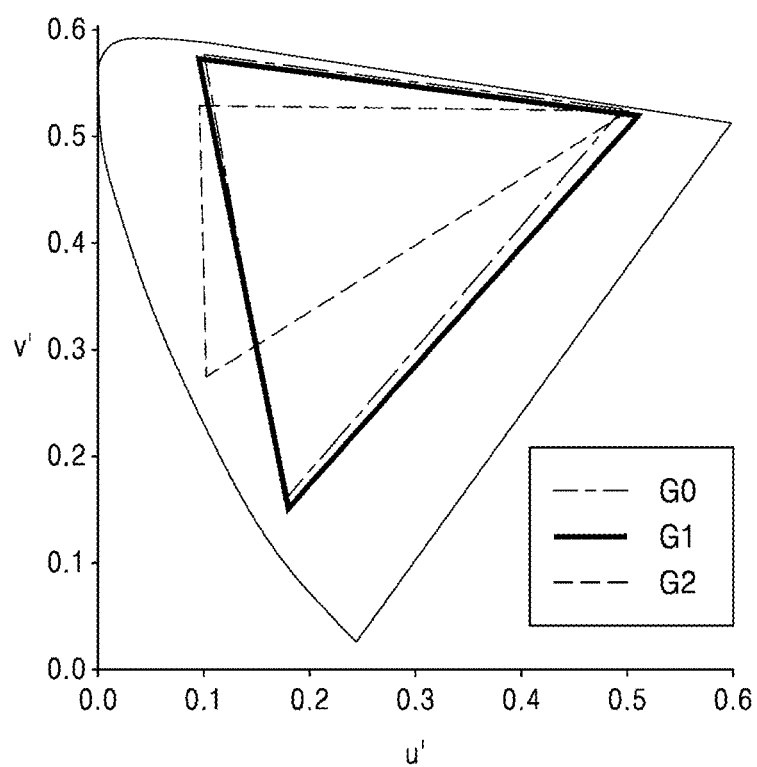
FIG. 6 is a diagram of a CIE 1931 color coordinate system showing a color gamut of a light emitting device for a display, according to one or more example embodiments.

FIG. 6 is a diagram of a CIE 1931 color coordinate system showing a color gamut of the light emitting device 100 for a display, according to one or more example embodiments. FIG. 6 illustrates a DCI color standard G0, a first gamut G1 that is the gamut of the first white light W1 emitted from the first light emitter 132, and a second gamut G2 that is the gamut of the second white light W2 emitted from the second light emitter 134.

Referring to FIG. 6, the first gamut G1 may cover at least 90% of the area of the DCI color standard G0. For example, the first gamut G1 may cover at least 95% of the area of the DCI color standard G0. The second gamut G2 may cover at least 60% of the area of the DCI color standard G0. For example, the second gamut G2 may cover at least 70% of the area of the DCI color standard G0. The light emitting device 100 for a display includes the first light emitter 132 and the second light emitter 134, thereby improving the circadian rhythm and realizing a high color reproducibility.

Figure 7:
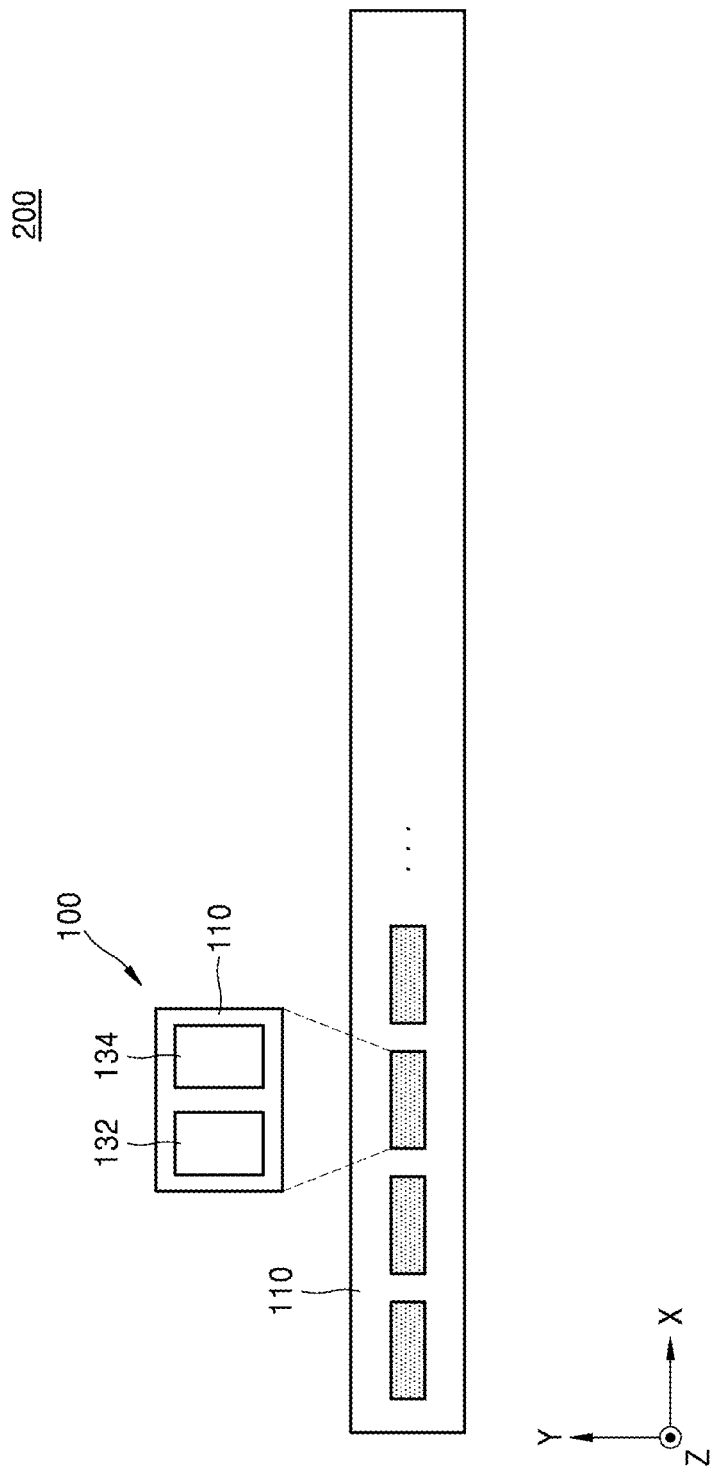
FIG. 7 is a diagram of a light emitting module including the light emitting device of FIG. 1 according to one or more example embodiments.

FIG. 7 is a diagram of a light emitting module 200 including the light emitting device 100 of FIG. 1 according to one or more example embodiments.

Referring to FIG. 7, the light emitting module 200 may include the light emitting device 100 for a display. The light emitting module 200 may have a shape that is longer in a first horizontal direction (the X direction) than in a second horizontal direction (the Y direction) in a plan view. The substrate 110 may have a rectangular band shape extending in the first horizontal direction (the X direction) in a plan view, and a plurality of light emitting devices 100 for a display may be arranged on the substrate 110 in the first horizontal direction (the X direction). For example, the light emitting devices 100 for a display may share the substrate 110.

Figure 8:
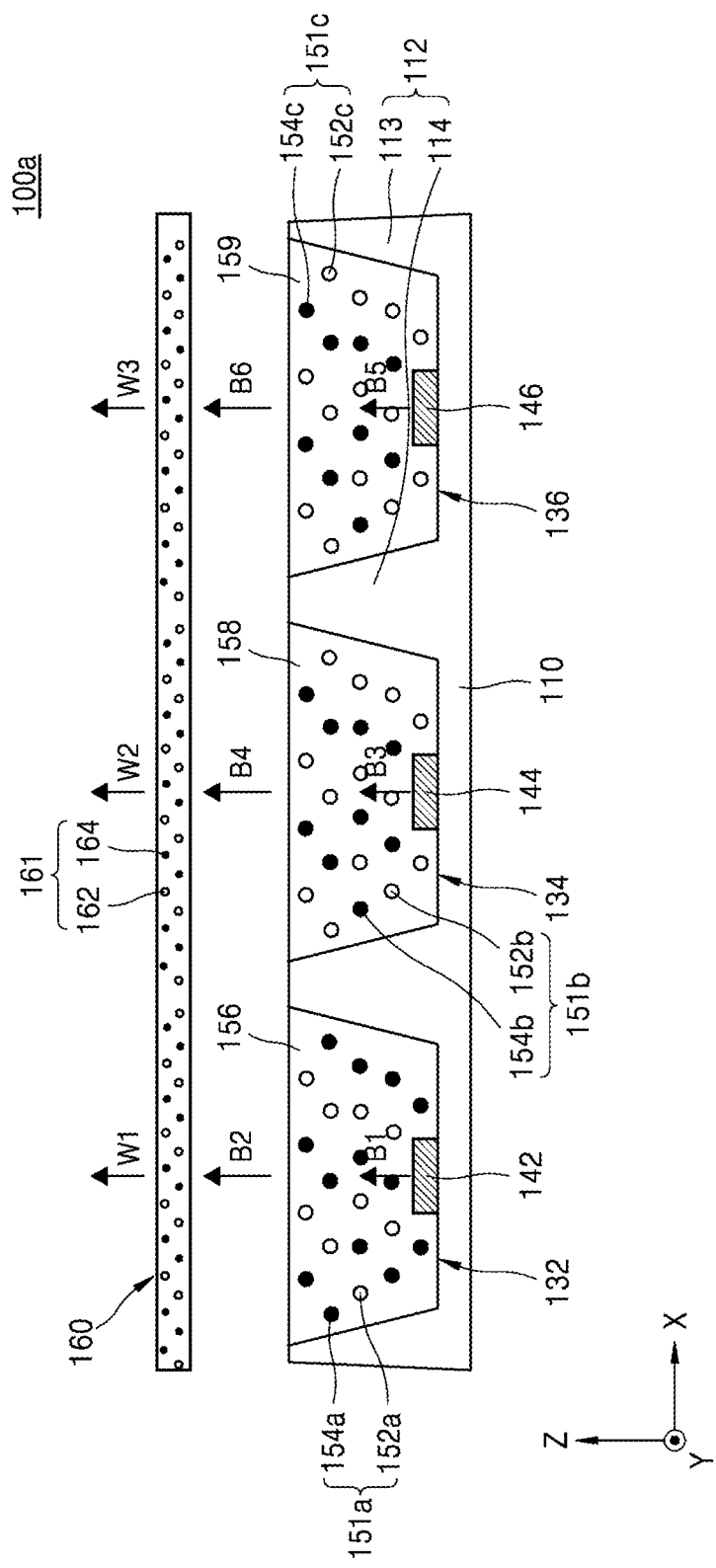
FIG. 8 is a cross-sectional view of a light emitting device for a display, according to one or more example embodiments.

FIG. 8 is a cross-sectional view of a light emitting device 100a for a display, according to one or more example embodiments. FIG. 8 differs from FIG. 1 in that the light emitting device 100a for a display further includes a third light emitter 136.

The light emitting device 100a for a display may further include the third light emitter 136. The third light emitter 136 may include a third light emitting chip 146, a third wavelength conversion phosphor 151c, and a third encapsulation material 159 surrounding the third light emitting chip 146 and the third wavelength conversion phosphor 151c. The third light emitting chip 146 may emit fifth blue light B5 having a peak wavelength in a range of about 430 nm to about 465 nm. In some embodiments, the fifth blue light B5 may have a peak wavelength in a range of about 445 nm to about 455 nm and desirably have a peak wavelength at about 450 nm. The third wavelength conversion phosphor 151c may include at least one of a fifth phosphor 152c and a sixth phosphor 154c. The fifth phosphor 152c may convert part of the fifth blue light B5 into light having a peak wavelength in a range of about 530 nm to about 560 nm. The sixth phosphor 154c may convert part of the fifth blue light B5 into light having a peak wavelength in a range of about 600 nm to about 650 nm. The third light emitter 136 may emit a sixth blue light B6 having a peak wavelength in a range of about 430 nm to about 465 nm. The sixth blue light B6 may be produced based on the part of the fifth blue light B5 converted by the fifth phosphor 152c and the part of the fifth blue light B5 converted by the sixth phosphor 154c.

The sixth blue light B6 may have the same coordinate range as the first coordinates CB2 corresponding to the CIE 1931 coordinates of the second blue light B2. For example, an x-coordinate in the CIE 1931 coordinates of the sixth blue light B6 may be about 0.1 to about 0.3, and a y-coordinate therein may be about 0.02 to about 0.2. For example, an x-coordinate in the CIE 1931 coordinates of the sixth blue light B6 may be about 0.18 to about 0.22, and a y-coordinate therein may be about 0.06 to about 0.12.

The fifth phosphor 152c may include at least one of the phosphors described above as being included in the first phosphor 152a. The sixth phosphor 154c may include at least one of the phosphors described above as being included in the second phosphor 154a. The third encapsulation material 159 may include epoxy resin, silicon, urethane resin, oxetane resin, acrylic resin, polycarbonate, polyimide, or a combination thereof.

A content of the fifth phosphor 152c may be substantially the same as a content of the first phosphor 152a, and a content of the sixth phosphor 154c may be substantially the same as a content of the second phosphor 154a, The third light emitter 136 may be substantially the same as the first light emitter 132. The light emitting device 100a for a display may include two first light emitters 132 and one second light emitter 134. For example, the second light emitter 134 may be between the two first light emitters 132.

The wavelength conversion film 160 may be in a path of light emitted from the third light emitter 136. For example, the third light emitter 136 may share the wavelength conversion film 160 with the first and second light emitters 132 and 134. The wavelength conversion film 160 may convert at least part of the sixth blue light B6 into third white light W3. An x-coordinate in the CIE 1931 coordinates of the third white light W3 may be about 0.28 to about 0.32, and a y-coordinate therein may be about 0.29 to about 0.33.

Figure 9:
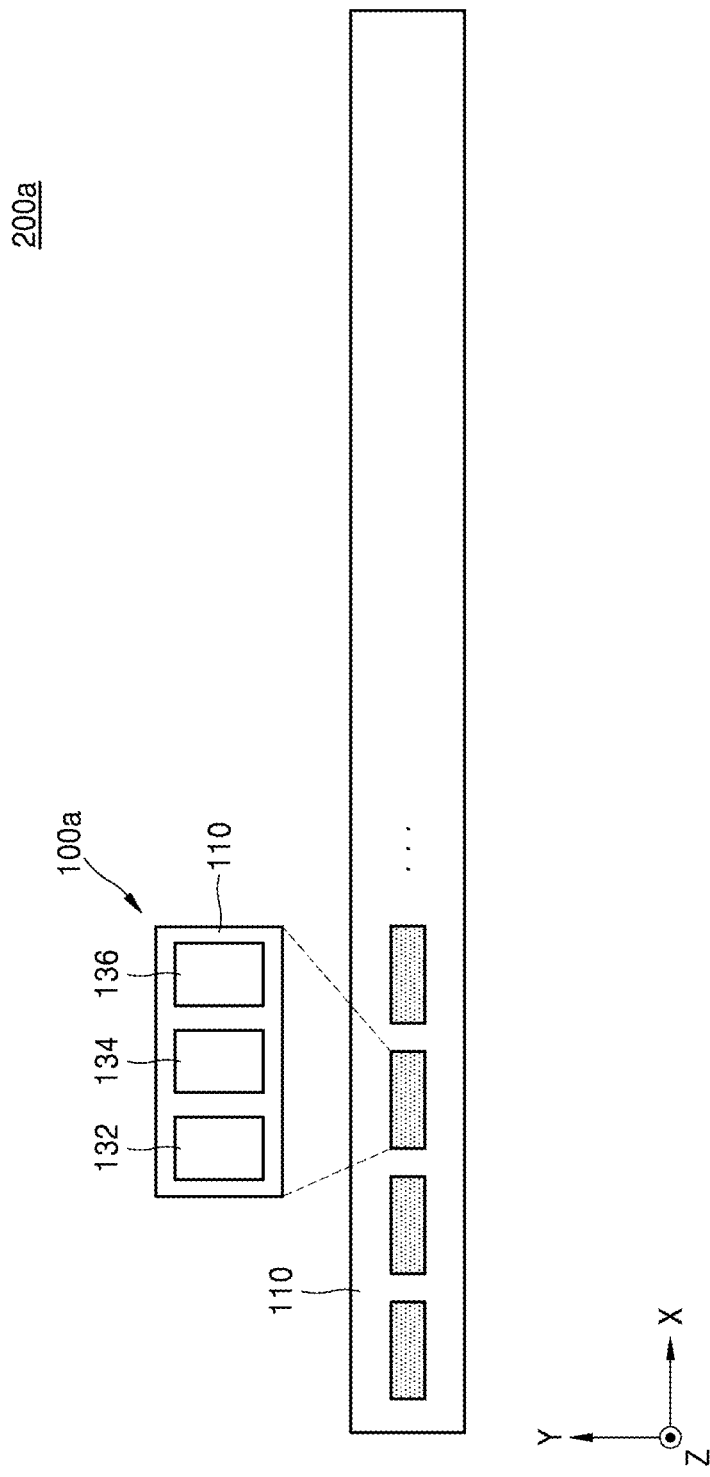
FIG. 9 is a diagram of a light emitting module including the light emitting device of FIG. 8 according to one or more example embodiments.

FIG. 9 is a diagram of a light emitting module 200a including the light emitting device 100a of FIG. 8 according to one or more example embodiments. FIG. 9 differs from FIG. 7 in that the light emitting module 200a includes the light emitting device 100a including the third light emitter 136.

Referring to FIG. 9, a plurality of light emitting devices 100a, each of which includes the first to third light emitters 132, 134, and 136 in the first horizontal direction (the X direction), may be arranged in the first horizontal direction (the X direction). The second light emitter 134 may be between the first light emitter 132 and the third light emitter 136 in the first horizontal direction (the X direction).

Figure 10:
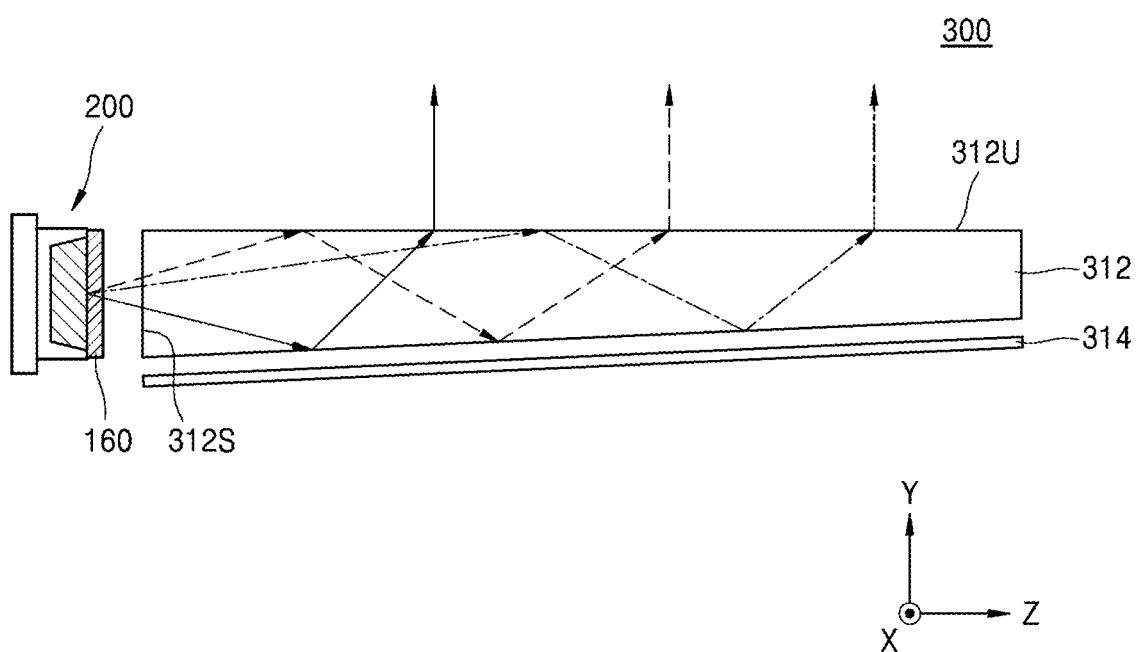
FIG. 10 is a cross-sectional view of a backlight unit according to one or more example embodiments.

FIG. 10 is a cross-sectional view of a backlight unit 300 according to one or more example embodiments.

Referring to FIG. 10, the backlight unit 300 may include the light emitting module 200, a light guide plate 312, and a reflector 314. The backlight unit 300 may be of an edge type, in which light is incident to a side surface 312S of the light guide plate 312.

The light emitting module 200 may be beside the light guide plate 312 and emit light to the side surface 312S of the light guide plate 312. According to embodiments, light incident to the side surface 312S of the light guide plate 312 may be reflected by the reflector 314 and emitted through a top surface 312U of the light guide plate 312. For example, a color filter may be on the top surface 312U of the light guide plate 312.

The wavelength conversion film 160 may be on the top of the light emitting module 200. The wavelength conversion film 160 may be directly on the respective top surfaces of the first and second light emitters 132 and 134. The wavelength conversion film 160 may be separated from the light guide plate 312 in the vertical direction (the Z direction).

Figure 11:
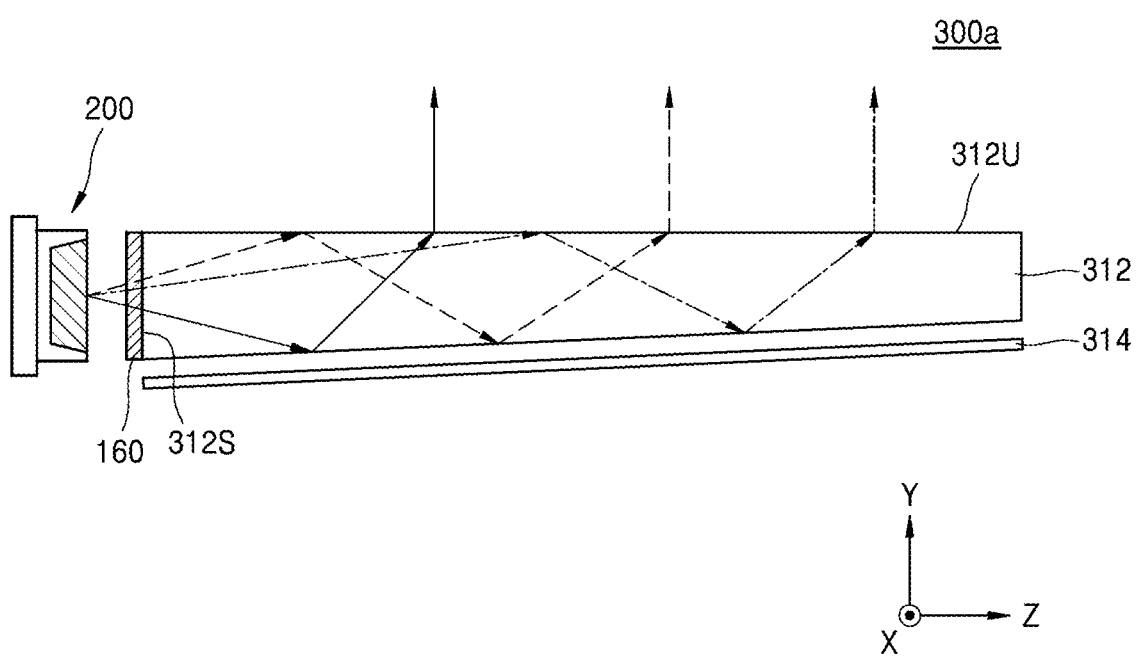
FIG. 11 is a cross-sectional view of a backlight unit according to one or more example embodiments.

FIG. 11 is a cross-sectional view of a backlight unit 300a according to one or more example embodiments. FIG. 11 differs from FIG. 10 in that the wavelength conversion film 160 is on the side surface 312S of the light guide plate 312, which is near the light emitting module 200.

Referring to FIG. 11, the wavelength conversion film 160 may be on the side surface 312S of the light guide plate 312. The wavelength conversion film 160 may be separated from the light emitting module 200 in the vertical direction (the Z direction).

Figure 12:
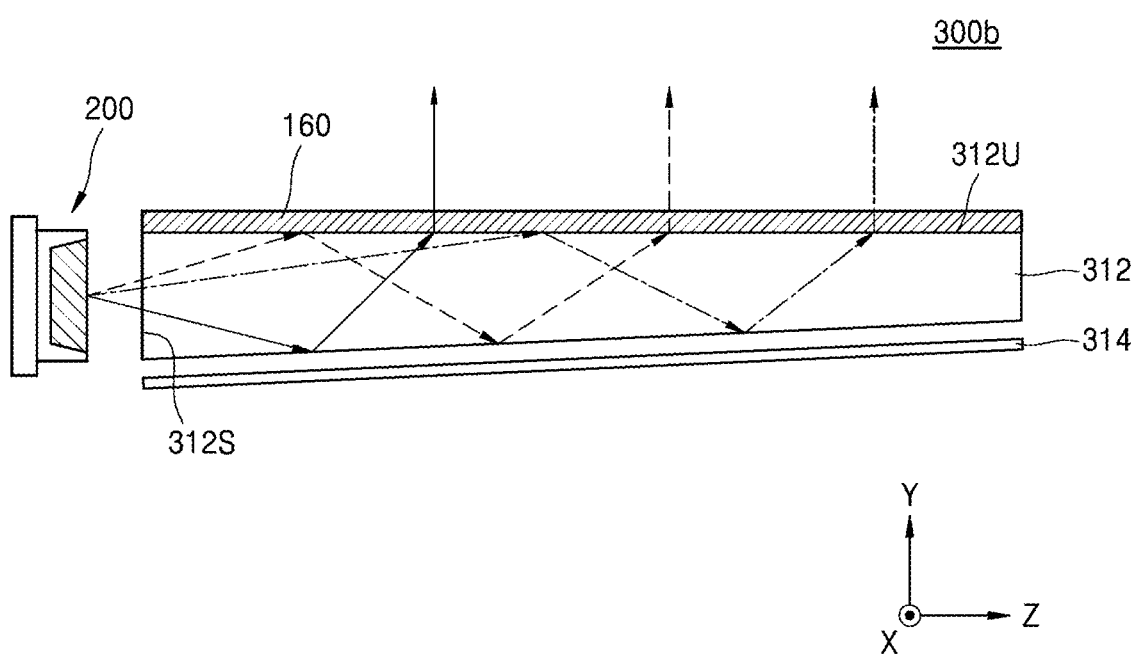
FIG. 12 is a cross-sectional view of a backlight unit according to one or more example embodiments.

FIG. 12 is a cross-sectional view of a backlight unit 300b according to one or more example embodiments. FIG. 12 differs from FIG. 10 in that the wavelength conversion film 160 is on the top surface 312U of the light guide plate 312.

Referring to FIG. 12, the wavelength conversion film 160 may be on the top surface 312U of the light guide plate 312. Blue light may be emitted from the light emitting module 200 and incident to the side surface 312S of the light guide plate 312. The blue light may be reflected by the reflector 314 to the top surface 312U of the light guide plate 312 and converted into white light by the wavelength conversion film 160 on the top surface 312U of the light guide plate 312.

Various experimental examples are described below with respect to Tables 1-5 to further demonstrate aspects of the disclosure. The values, aspects, and other components for producing the experimental results below are examples and not exclusive of the embodiments disclosed herein.

The light emitting device 100 for a display was manufactured using the first light emitting chip 142 having a peak wavelength of about 450 nm and the second light emitting chip 144 having a peak wavelength of about 480 nm such that the second blue light B2 of the first light emitter 132 and the fourth blue light B4 of the second light emitter 134 have MRs of Table 1 below. In the experiments, emission spectra were measured using CAS140 from Instrument Systems.

TABLE 1

| Experimental examples | MR(B2) | MR(B4) | MR(B4)/MR(B2) |
|---|---|---|---|
| Experimental example A | 3.02 | 3.67 | 1.22 |
| Experimental example B | 1.64 | 3.12 | 1.91 |
| Experimental example C | 1.66 | 3.94 | 2.37 |
| Experimental example D | 15.85 | 7.43 | 0.47 |

Experimental Example A

The intensity of the peak wavelength of each of the second blue light B2 and the fourth blue light B4 of the light emitting device 100 for a display according to Experiment Example A in Table 1 was changed as shown in Table 2 below, and the EML of the first white light W1 and the EML of the second white light W2 were measured.

TABLE 2

| Experimental example A | Peak intensity(B4)/Peak intensity(B2) | EML(W2)/EML(W1) |
|---|---|---|
| A-1 | 0.4 | 0.82 |
| A-2 | 0.5 | 1.02 |
| A-3 | 0.6 | 1.23 |
| A-4 | 0.7 | 1.43 |
| A-5 | 0.8 | 1.64 |

Experimental Example B

The intensity of the peak wavelength of each of the second blue light B2 and the fourth blue light B4 of the light emitting device 100 for a display according to Experiment Example B in Table 1 was changed as shown in Table 3 below, and the EML of the first white light W1 and the EML of the second white light W2 were measured.

TABLE 3

| Experimental example B | Peak intensity(B4)/Peak intensity(B2) | EML(W2)/EML(W1) |
|---|---|---|
| B-1 | 0.4 | 0.69 |
| B-2 | 0.5 | 0.86 |
| B-3 | 0.6 | 1.03 |
| B-4 | 0.7 | 1.2 |
| B-5 | 0.8 | 1.37 |

Experimental Example C

The intensity of the peak wavelength of each of the second blue light B2 and the fourth blue light B4 of the light emitting device 100 for a display according to Experiment Example C in Table 1 was changed as shown in Table 4 below, and the EML of the first white light W1 and the EML of the second white light W2 were measured.

TABLE 4

| Experimental example C | Peak intensity(B4)/Peak intensity(B2) | EML(W2)/EML(W1) |
|---|---|---|
| C-1 | 0.4 | 0.72 |
| C-2 | 0.5 | 0.91 |
| C-3 | 0.6 | 1.09 |
| C-4 | 0.7 | 1.27 |
| C-5 | 0.8 | 1.45 |

Experimental Example D

The intensity of the peak wavelength of each of the second blue light B2 and the fourth blue light B4 of the light emitting device 100 for a display according to Experiment Example D in Table 1 was changed as shown in Table 5 below, and the EML of the first white light W1 and the EML of the second white light W2 were measured.

TABLE 5

| Experimental example D | Peak intensity(B4)/Peak intensity(B2) | EML(W2)/EML(W1) |
|---|---|---|
| D-1 | 0.4 | 0.68 |
| D-2 | 0.5 | 0.85 |
| D-3 | 0.6 | 1.02 |
| D-4 | 0.7 | 1.19 |
| D-5 | 0.8 | 1.36 |

Referring to Tables 2 to 5, when a ratio of the intensity of the peak wavelength of the fourth blue light B4 to the intensity of the peak wavelength of the second blue light B2 is greater than or equal to 0.6, it may be seen that a ratio of the EML of the second white light W2 to the EML of the first white light W1 is greater than or equal to 1. For example, when the EML of the second white light W2 is greater than the EML of the first white light W1, the circadian rhythm may be improved.

According to example embodiments, a light emitting device for a display may include a first light emitting chip, which has a peak wavelength in a range of 430 nm to 465 nm, and a second light emitting chip, which has a peak wavelength in a range of 465 nm to 500 nm. A ratio of the intensity of the peak wavelength of light, which is emitted from a second light emitting unit including the second light emitting chip, to the intensity of the peak wavelength of light, which is emitted from a first light emitting unit including the first light emitting chip, may be is greater than or equal to 0.6. Accordingly, the EML of the second white light W2 may be greater than the EML of the first white light W1. When the light emitting device is used as a light source of a display, the circadian rhythm and the color reproducibility may be improved.

Each of the embodiments provided in the above description is not excluded from being associated with one or more features of another example or another embodiment also provided herein or not provided herein but consistent with the disclosure While the disclosure has been particularly shown and described with reference to example embodiments thereof, it will be understood that various changes in form and details may be made therein without departing from the spirit and scope of the following claims.

What is claimed is:
1. A backlight unit comprising:
a light guide plate;
a reflector; and
a light emitting module comprising a light emitting device and a substrate,
wherein the light emitting device comprises a first light emitter and a second light emitter,
wherein the first light emitter is configured to emit second blue light having a peak wavelength in a range of 430 nm to 465 nm, wherein the first light emitter comprises:
   a first light emitting chip configured to emit first blue light having a peak wavelength in a range of 430 nm to 465 nm,
   a first wavelength conversion phosphor comprising at least one of a green phosphor and a red phosphor, and
   a first encapsulation material around the first light emitting chip and the first wavelength conversion phosphor;
wherein the second light emitter is configured to emit fourth blue light having a peak wavelength in a range of 465 nm to 500 nm,
wherein the second light emitter comprises:
   a second light emitting chip configured to emit third blue light having a peak wavelength in a range of 465 nm to 500 nm,
   a second wavelength conversion phosphor comprising at least one of the green phosphor and the red phosphor, and
   a second encapsulation material around the second light emitting chip and the second wavelength conversion phosphor;
wherein the backlight unit further comprises:
   a light emitting package around the first light emitter and the second light emitter, and exposing a top surface of the first light emitter and a top surface of the second light emitter; and
   a wavelength conversion film configured to convert at least part of the second blue light and at least part of the fourth blue light into white light,
wherein the light emitting module is in an edge portion of the light guide plate, and
wherein a ratio of an intensity of the peak wavelength of the fourth blue light to an intensity of the peak wavelength of the second blue light is greater than or equal to 0.6.

2. The backlight unit of claim 1, wherein, in a range of first coordinates corresponding to CIE 1931 coordinates of the second blue light, an x-coordinate is 0.18 to 0.22, and a y-coordinate is 0.06 to 0.12, and
wherein, in a range of second coordinates corresponding to CIE 1931 coordinates of the fourth blue light, an x-coordinate is 0.2 to 0.24, and a y-coordinate is 0.16 to 0.22.

3. The backlight unit of claim 1, wherein the wavelength conversion film is on a top surface of the light emitting package.

4. The backlight unit of claim 1, wherein the wavelength conversion film is on a side surface of the light guide plate.

5. The backlight unit of claim 1, wherein the wavelength conversion film is on a top surface of the light guide plate.

6. The backlight unit of claim 1, wherein the wavelength conversion film is separated from the top surface of the first light emitter and the top surface of the second light emitter.

7. The backlight unit of claim 6, wherein the peak wavelength of the second blue light in a range of 430 nm to 465 nm, and
wherein the peak wavelength of the fourth blue light in a range of 465 nm to 500 nm.

8. The backlight unit of claim 1, wherein the wavelength conversion film has an integral structure in a path of the second blue light and a path of the fourth blue light.

9. A backlight unit comprising:
a light guide plate;
a reflector; and
a light emitting module comprising a light emitting device and a substrate,
wherein the light emitting device comprises a first light emitter and a second light emitter,
wherein the first light emitter is configured to emit second blue light,
wherein the first light emitter comprises:
   a first light emitting chip configured to emit first blue light having a peak wavelength in a range of 430 nm to 465 nm,
   at least one of a first phosphor configured to convert part of the first blue light into light having a peak wavelength in a range of 530 nm to 560 nm, and a second phosphor configured to convert part of the first blue light into light having a peak wavelength in a range of 600 nm to 650 nm,
wherein the second light emitter is configured to emit fourth blue light,
wherein the second light emitter comprises:
   a second light emitting chip configured to emit third blue light having a peak wavelength in a range of about 465 nm to about 500 nm, and
   at least one of a third phosphor configured to convert part of the third blue light into light having a peak wavelength in a range of 530 nm to 560 nm, and a fourth phosphor configured to convert part of the third blue light into light having a peak wavelength in a range of 600 nm to 650 nm, and
wherein a ratio of an intensity of a peak wavelength of the fourth blue light to an intensity of a peak wavelength of the second blue light is greater than or equal to 0.6.

10. The backlight unit of claim 9, wherein the first light emitter further comprises the first phosphor,
wherein the second light emitter further comprises the third phosphor, and
wherein each of the first phosphor and the third phosphor comprises at least one of β-SiAlON:Eu, (Ga,Gd,Y)2Al5O12:Ce, La3Si6Ni:Ce, Eu-doped (Sr,Ca,Ba)Si2O2N2:Eu, and (Sr,Ba)Si2O4:Eu.

11. The backlight unit of claim 9, wherein the first light emitter further comprises the second phosphor, and
wherein the second light emitter further comprises the fourth phosphor, and each of the second phosphor and the fourth phosphor comprises at least one of (Sr,Ca)AlSiN3:Eu, CaAlSiN3:Eu, and $K_xSiF_y$:Mn4+ ($2 \leq x \leq 3$, $4 \leq y \leq 7$).

12. The backlight unit of claim 9, wherein the second light emitter does not comprise the third phosphor.

13. The backlight unit of claim 9, wherein, in a range of first coordinates corresponding to CIE 1931 coordinates of the second blue light, an x-coordinate is 0.18 to 0.22 and a y-coordinate is 0.06 to 0.12.

14. The backlight unit of claim 9, wherein, in a range of second coordinates corresponding to CIE 1931 coordinates of the fourth blue light, an x-coordinate is 0.2 to 0.24 and a y-coordinate is 0.16 to 0.22.

15. The backlight unit of claim 9, further comprising a wavelength conversion film in a path of the second blue light and a path of the fourth blue light, the wavelength conversion film being configured to:
   convert at least part of the second blue light into first white light, and
   convert at least part of the fourth blue light into second white light, wherein the wavelength conversion film comprises:
a first quantum dot configured to convert part of each of the second blue light and the fourth blue light into light having a peak wavelength in a range of 510 nm to 550 nm; and
a second quantum dot configured to convert part of each of the second blue light and the fourth blue light into light having a peak wavelength in a range of 610 nm to 660 nm.

16. The backlight unit of claim 15, wherein each of the first quantum dot and the second quantum dot comprises at least one of InP/ZnS, InP/ZnSe, CdSe/CdS, CdSe/ZnS, PbS/ZnS, and InP/GaP/ZnS.

17. The backlight unit of claim 15, wherein, in a range of third coordinates corresponding to CIE 1931 coordinates of the first white light, an x-coordinate is 0.28 to 0.32 and a y-coordinate is 0.29 to 0.33, and
wherein in a range of fourth coordinates corresponding to CIE 1931 coordinates of the second white light, an x-coordinate is 0.28 to 0.32 and a y-coordinate is 0.29 to 0.33.

18. A backlight unit comprising:
a light guide plate;
a reflector; and
a light emitting module comprising a light emitting device and a substrate,
wherein the light emitting device comprises a first light emitter and a second light emitter,
wherein the first light emitter is configured to emit second blue light,
wherein the first light emitter comprises:
a first light emitting chip configured to emit first blue light having a peak wavelength in a range of 430 nm to 465 nm,
at least one of a first phosphor configured to convert part of the first blue light into light having a peak wavelength in a range of 530 nm to 560 nm, and a second phosphor configured to convert part of the first blue light into light having a peak wavelength in a range of 600 nm to 650 nm,
wherein the second light emitter is configured to emit fourth blue light,
wherein the second light emitter comprises:
a second light emitting chip configured to emit third blue light having a peak wavelength in a range of about 465 nm to about 500 nm, and
at least one of a third phosphor configured to convert part of the third blue light into light having a peak wavelength in a range of about 530 nm to about 560 nm, and a fourth phosphor configured to convert part of the third blue light into light having a peak wavelength in a range of about 600 nm to about 650 nm,
wherein the backlight unit further comprises:
a light emitting package around the first light emitter and the second light emitter, and exposing a top surface of the first light emitter and a top surface of the second light emitter; and
a wavelength conversion film in a path of the second blue light and a path of the fourth blue light, the wavelength conversion film being configured to:
convert at least part of the second blue light into first white light, and
convert at least part of the fourth blue light into second white light,
wherein the light emitting module is in an edge portion of the light guide plate, and
wherein a ratio of an intensity of the peak wavelength of the fourth blue light to an intensity of the peak wavelength of the second blue light is greater than or equal to 0.6.

19. The backlight unit of claim 18, further comprising a plurality of first light emitters, wherein the plurality of first light emitters comprise the first light emitter.

20. The backlight unit of claim 18, wherein an equivalent melanopic lux (EML) of the second white light is greater than an EML of the first white light.

* * * * *